United States Patent [19]

Suzuki

[11] Patent Number: 4,959,255
[45] Date of Patent: Sep. 25, 1990

[54] CERAMIC SUBSTRATES AND METHOD OF MANUFACTURING THE SAME

[75] Inventor: Go Suzuki, Nagoya, Japan

[73] Assignee: NGK Insulators, Ltd., Japan

[21] Appl. No.: 251,700

[22] PCT Filed: Apr. 16, 1988

[86] PCT No.: PCT/JP88/00383
§ 371 Date: Aug. 31, 1988
§ 102(e) Date: Aug. 31, 1988

[87] PCT Pub. No.: WO88/07983
PCT Pub. Date: Oct. 20, 1988

[30] Foreign Application Priority Data

Apr. 16, 1987 [JP]   Japan ................................ 62-92060

[51] Int. Cl.$^5$ .............................................. B32B 3/10
[52] U.S. Cl. ...................... 428/143; 428/141;
428/145; 428/212; 428/220; 428/325; 428/328;
428/332; 428/409; 428/426; 428/432; 428/698;
428/901
[58] Field of Search ............... 428/141, 143, 145, 212,
428/220, 325, 328, 332, 409, 426, 432, 698, 901

[56] References Cited

U.S. PATENT DOCUMENTS

| | | | |
|---|---|---|---|
| 4,055,451 | 10/1977 | Cockbain et al. | 428/325 |
| 4,484,972 | 11/1984 | Ebata et al. | 428/698 |
| 4,615,763 | 10/1986 | Gelorme et al. | 156/643 |
| 4,684,446 | 8/1987 | Charles et al. | |

FOREIGN PATENT DOCUMENTS

| | | |
|---|---|---|
| 124000 | 11/1984 | European Pat. Off. . |
| 219122 | 4/1987 | European Pat. Off. . |
| 62-88392 | 4/1987 | Japan . |
| 62-88394 | 4/1987 | Japan . |

Primary Examiner—Ellis P. Robinson
Assistant Examiner—Archene A. Turner
Attorney, Agent, or Firm—Arnold, White & Durkee

[57] ABSTRACT

Granular protruding portions are formed on a surface of a dense ceramic body to be provided at its surface with an electrolessly plated layer. A space is formed between the granular protruding portions so as to substantially widen toward the interior viewed from the surface side, whereby a part of the electrolessly plated layer to be formed is entered and solidified in the spaces to develop a strong anchor effect. This anchor effect provides a strong and stable bonding strength of the electrolessly plated layer to the ceramic substrate, so that it is particularly useful as a ceramic substrate for circuit boards of electronic parts.

5 Claims, 7 Drawing Sheets

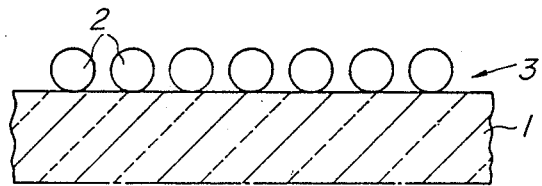
FIG_1A
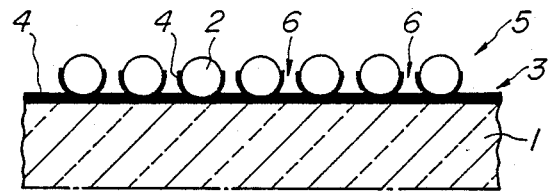
FIG_1B
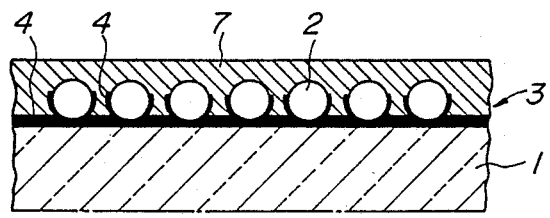
FIG_1C
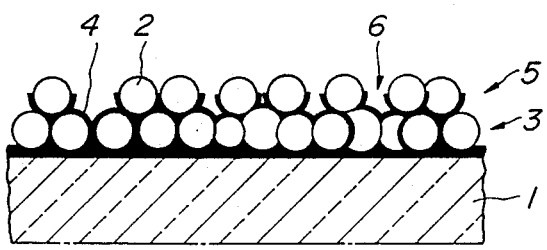
FIG_2

FIG_3A
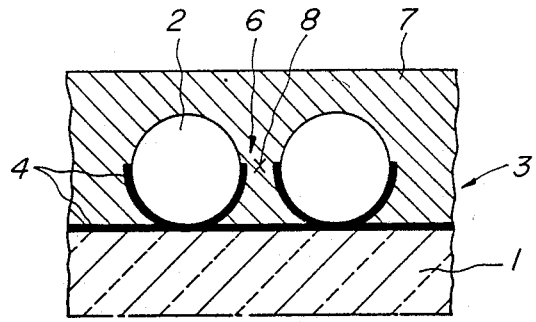
FIG_3B
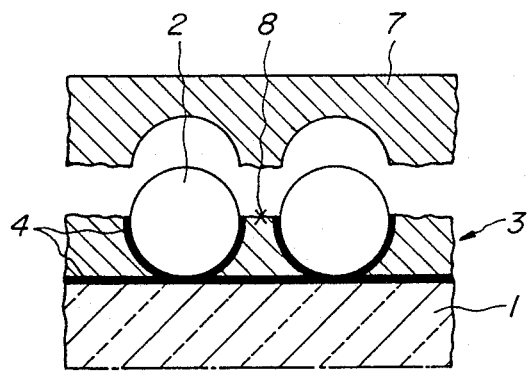

FIG_4A
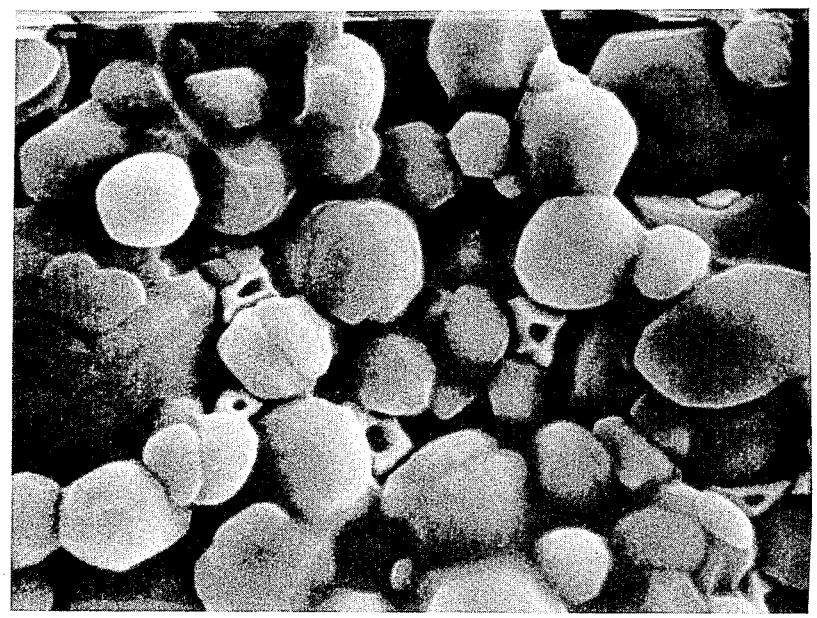
(Magnification: x5000)

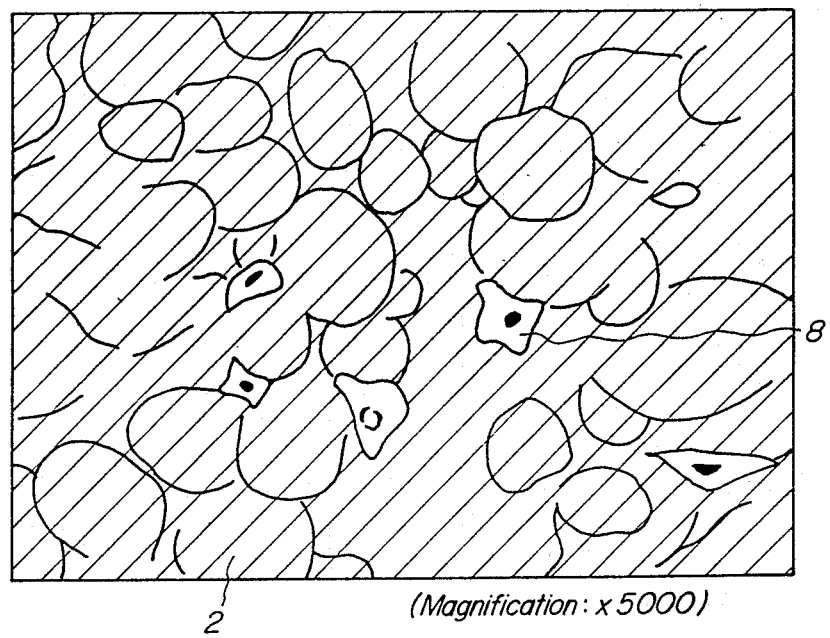
FIG_4B
(Magnification: ×5000)

FIG_5A
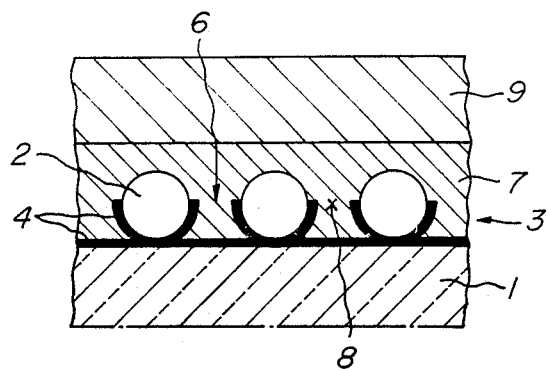
FIG_5B
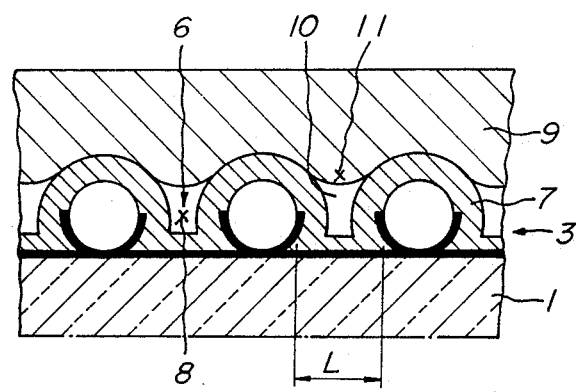

FIG_6A
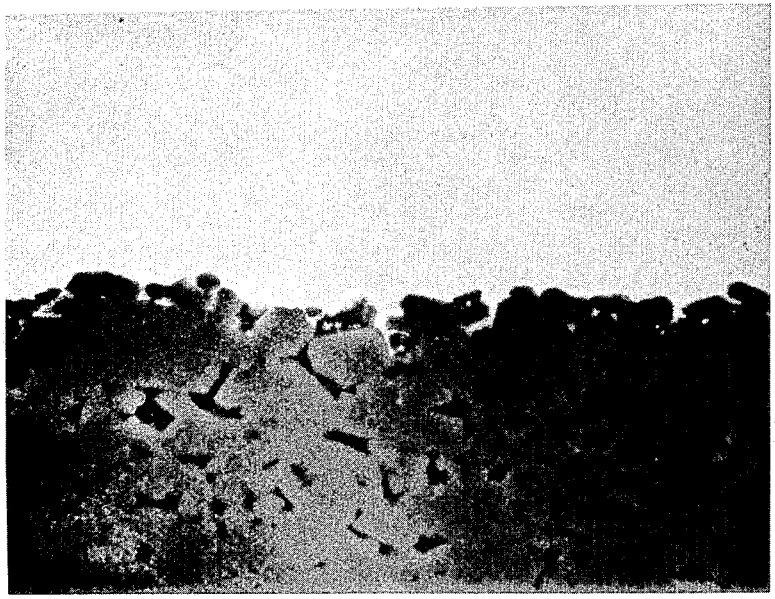
(Magnification: x 2000)

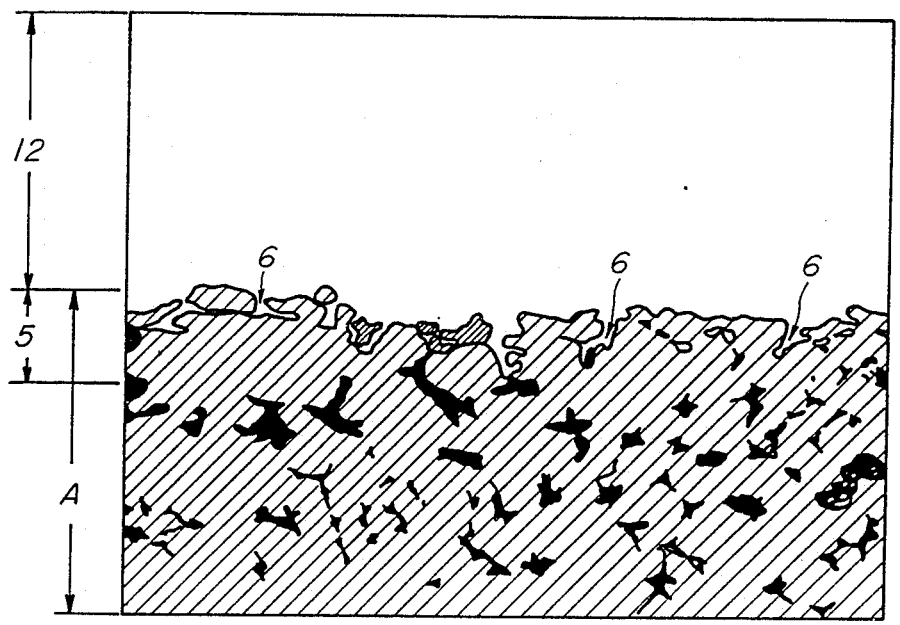
FIG_6B
(Magnification: x2000)

CERAMIC SUBSTRATES AND METHOD OF MANUFACTURING THE SAME

BACKGROUND OF THE INVENTION

1. Technical Field

The present invention relates to a ceramic substrate being subjected at its surface to an electroless plating, and a method of manufacturing the ceramic substrate.

2. Background Art

Heretofore, when a metallic film for joining a different metal or as a conductor is formed on the surface of the ceramic substrate, the following have been used as a process for direct electroless plating:

(a) a process in which the surface of the ceramic substrate is subjected to a surface roughening treatment with an etching solution containing an alkali metal compound, adsorbed with a catalyst for an electroless plating and then subjected to the electroless plating;

(b) a process in which an activated paste is applied to the surface of the ceramic substrate and baked to form a plated layer and then an electroless plating is applied to the plated layer;

(c) a process in which a resin sheet whose surface has been roughened is adhered to the surface of the ceramic substrate, and then a catalyst for an electroless plating is adsorbed on the resin sheet, which is subjected to the electroless plating; and (d) a process in which an alumina paste containing an excessive amount of an organic binder than normal is print-applied onto a part or a whole surface of a green (ceramic) sheet and then simultaneously fired to form a ceramic substrate having a porous surface, and thereafter the surface of the ceramic substrate is subjected to an electroless plating (Japanese Patent laid open No. 59-161,896).

DISCLOSURE OF INVENTION

The above described processes, however, have the following problems:

Case of item (a)

(i) The etching solution is apt to remain in accordance with the state of the roughened surface, so that a corrosion phenomenon is liable to result at a boundary between the electrolessly plated layer and the ceramic substrate after the electroless plating;

(ii) In the well-known etching method using, for example, a high-temperature alkali metal compound, especially a hydroxide or the like of an alkali metal dissolved at about 400° C., it is difficult to conduct a uniform etching due to uneven heating, so that scattering in the bonding force between the electrolessly, plated layer and the ceramic substrate is likely to occur.

Case of item (b)

Since the bonding strength by the activated paste is dependent upon the bonding force of the activated paste, it is necessary to conduct a high-temperature sintering at about 600° C. in order to increase the bonding strength. However, when the ceramic substrate is used as a substrate for an electronic circuit, if resistors, magnetic materials, dielectrics and so on are provided as functional parts of the electronic circuit under the baking conditions different from those for the formation of conductors before the electroless plating, these parts are exposed to the aforementioned high-temperature sintering. As a result, the characteristics of the functional parts are changed by such a high-temperature sintering, so that it is difficult to ensure stable characteristics.

Case of item (c)

Since the resin sheet is interposed between the electrolessly plated layer and the ceramic substrate, the heat characteristics such as heat resistance, high-thermal conductivity of ceramic as the substrate are damaged due to the resin sheet.

Case of item (d)

(i) For example, when copper plating is applied as an electroless plating, the bonding force between the copper plated layer and the ceramic substrate is only obtained in about 1.2~2 times as compared with a ceramic substrate having no porous structure, which is still insufficient.

(ii) When the surface roughness of the porous layer after the firing is considerably roughened by adding an excess amount of the organic binder to increase the viscosity of the alumina paste in order to provide the bonding force, it is difficult to form finer wiring patterns on the electrolessly plated layer due to the high degree, of surface roughness.

Also, in a step for forming the wiring pattern by etching, if the etching solution is not rinsed sufficiently, the etching solution will remain due to the high surface roughness, resulting in inferior insulation of the wiring pattern.

Furthermore, in the case of the ceramic substrate for the formation of a wiring pattern for a high-frequency signal, the transmission loss increases as the surface roughness becomes larger. For example, it has been reported that the transmission loss at a high-frequency signal of 20 GHz increases sharply when the average surface roughness exceeds 1.0 $\mu$m. (Reporter; Akira Morita, Hisashi Tomimuro: The Institute of Electronics and Communication Engineers, The lecture papers of the general national convention in 1983: 3-152),

SUMMARY OF THE INVENTION

It is an object of the present invention to solve these problems.

The ceramic substrate according to the present invention is characterized in that granular protruding portions are formed on a surface of a dense ceramic body to be provided with an electrolessly plated layer, and a space is formed between said granular protruding portions so as to substantially widen toward the interior viewed from the surface side.

According to the above construction, the bonding strength can be obtained between the electrolessly plated layer and the ceramic substrate by a strong anchor effect through the space substantially widened toward the interior between the granular protruding portions viewing from the surface side. Thus, it is possible to provide a ceramic substrate stably giving the bonding strength without etching, which causes corrosion, or an active metallizing treatment requiring the high-temperature sintering, and without the use of the resin sheet damaging the heat characteristics of the ceramic substrate. Moreover, since the plating is an electroless plating, it is not required to conduct the heat treatment at a high temperature during the plating process. Therefore, when the ceramic substrate is used for electronic circuits, it is possible to form circuits by the electroless plating after the existing resistors through thick film process, thin film process, plating process or the like, the existing dielectric or translucent bodies through thick film process, thin film process or the like and the existing magnetic bodies through thick film process, thin film process or the like are formed on the ceramic substrate.

It is preferable that a ratio of total area of the necked portion in the widened space per a given surface area of the substrate is 0.5~10%, and that the number of the necked portions is 2,000~100,000 per unit square millimeter.

Further, it is preferable that the ratio of total area of the necked portion per the given surface area of the substrate is 3~7% and the number of the necked portions is 5,000~20,000 per unit square millimeter.

Moreover, it is preferable that the surface roughness in the substrate surface is 0.4~1.0 μm as an average surface roughness.

The method of manufacturing a ceramic substrate according to the present invention comprises the steps of:

(a) forming a multilayer structure consisting of a green ceramic containing a ceramic material densified through firing and a surface-layer ceramic composed of or containing a granular ceramic material;

(b) sintering the multilayer structure at such a temperature that the green ceramic is densified and the granular ceramic material is bonded to the resulting densified body, whereby a space is formed between granular protruding portions made of the granular ceramic material so as to substantially widen toward the interior viewed from the surface side.

Therefore, the end portion of the granular ceramic material in the surface-layer ceramic facing to the green ceramic side is bonded to the green ceramic densified by at least a crystal binder in the green ceramic through the sintering to form the granular protruding portions. Thus, the space substantially widened toward the interior viewing from the surface side on the basis of the granular shape of the material is formed between the granular protruding portions on the surface of the ceramic substrate.

As a result, when the electroless plating is applied to the ceramic substrate, a part of the resulting electrolessly plated layer enters into the space and then is solidified to exhibit a strong anchor effect.

BRIEF DESCRIPTION OF THE DRAWINGS

FIG. 1A to FIG. 6B are drawings for illustrating the concrete embodiments of the ceramic substrate and the method of manufacturing the same according to the present invention, wherein:

FIG. 1A to FIG. 1C are cross sectional views each showing an outline in the fundamental process of manufacturing the ceramic substrate according to the present invention as a basic model;

FIG. 2 is a cross sectional view corresponding to FIG. 1B when the granular ceramic material forms two layers;

FIG. 3A and FIG. 3B are cross sectional views corresponding to an enlarged view of a part of FIG. 1C and showing states before and after the peeling of the electrolessly plated layer cut off in the necked portions of the spaces, respectively;

FIG. 4A and FIG. 4B are a scanning electron microphotograph and its schematically plan view showing the remaining portions of the electrolessly plated layer cut off in the necked portions of the spaces;

FIG. 5A and FIG. 5B are cross sectional views showing a case that the number of the spaces is large and the area of the necked portion per one space is small and the spaces are completely filled with the electrolessly plated layer, and a case that the number of the spaces is small and the area of the necked portion per one space is large and the spaces are incompletely filled with the electrolessly plated layer, respectively; and FIG. 6A and FIG. 6B are a scanning electron microphotograph and its schematically cross sectional view showing the granular structure of the ceramic substrate according to the present invention.

DETAILED DESCRIPTION OF THE PREFERRED EMBODIMENT

The embodiments of the ceramic substrate and the method of manufacturing the ceramic substrate according to the present invention will be described with reference to the accompanying drawings below.

First of all, the basic model will be described with reference to FIG. 1A to FIG. 1C.

Onto a green sheet (green tape) 1 as a green ceramic according to the present invention, which is formed by mixing a starting ceramic material and a flux of glass component as an example of a crystal binder, and further a proper organic binder, a plasticizer and an organic solvent, are arranged spheres of granular ceramic material 2, which is a kind of the granule (e.g. spherical, branch-like, rod-like, indeterminate form and so on) as shown in FIG. 1A to form a surface-layer ceramic 3, whereby a multilayer structure is formed. When the green sheet 1 is then sintered, the glass component of the crystal binder exudes from the green sheet 1 to wet the surface of the granular ceramic material 2 or the like as shown in FIG. 1B, whereby a binding layer 4 made of the glass component is formed. After the sintering, the end portion on the lower side of the granular ceramic material 2 is strongly bonded to the green sheet 1 densified by the sintering through the binding layer 4. Thus, the granular protruding portions 5 are formed by the granular ceramic material 2, and consequently spaces 6 are formed between the granular protruding portions 5 so as to widen toward the interior viewing from the surface side. A part of the electrolessly plated layer to be formed is entered and solidified in the spaces 6 as shown in FIG. 1C to develop a strong anchor effect.

Therefore, when the baking for thick-film resistors, dielectrics, conductors and so on is required after the formation of the electrolessly plated layer 7, the peeling, blistering or the like of the electrolessly plated layer 7 due to the difference of thermal expansion coefficient between the electrolessly plated layer 7 and the ceramic substrate A comprised of the green sheet 1 with the granular protruding portions 5 and the surface-layer ceramic 3 can be prevented by the aforementioned anchor effect.

As the ceramic material including the granular ceramic material 2, mention may be made of alumina, beryllia, cordierite, silicon carbide, forsterite, zirconia, mullite and so on. As the crystal binder, use may be made of any materials acting as a sintering aid for the main ceramic material such as the aforementioned glass-component, a material having a melting point lower than that of the main ceramic material and a diffusion coefficient larger than that thereof and the like. Because, the crystal binder is large in the migration during the firing and has a property that it is diffused by a concentration gradient to migrate to the surface such as grain boundary having a low energy level or the like, resulting in the wetting to the surface of the granular ceramic material 2.

Although the basic model has been described with respect to the surface-layer ceramic 3 including no crystal binder and comprised of the granular ceramic material 2 in one layer, the surface-layer ceramic 3 may include the crystal binder or the granular ceramic material 2 may be arranged in two or more layers. Moreover, the state corresponding to FIG. 1B in case of two layer is shown in FIG. 2, wherein the same reference numerals designate the same parts.

Next, the conditions for the formation of the granular protruding portions 5 as above-described will be described in detail.

(1) Crystal binder, etc.

The compounding ratio by weight of the component included in the green sheet 1 as a crystal binder to the green sheet 1 is larger than the compounding ratio by weight of the component included in the granular ceramic material 2 or the surface-layer ceramic 3 to the surface-layer ceramic 3.

This reason is based on the fact that at least outermost grains in the surface-layer ceramic 3 formed on the green sheet 1 are not buried with the crystal binder to form the granular protruding portions 5.

(2) The sintering is carried out at such a temperature that the green sheet 1 is densified and the granular ceramic material 2 is bonded to the resulting densified body.

This reason is based on the fact that if the sintering is carried out at a temperature of firing the surface-layer ceramic 3, the green sheet 1 is not densified and becomes brittle.

Next, the bonding strength of the electrolessly plated layer 7 will be described by making a quantitative explanation for the space 6 with reference to FIG. 3A enlargedly showing a part of FIG. 1 and further to FIG. 3B.

When the electrolessly plated layer 7 is peeled off from the ceramic substrate A from a state that the electrolessly plated layer 7 is adhered to the ceramic substrate A as shown in FIG. 3A, it is cut at a position called as a necked portion 8 where the two granular ceramic materials 2, 2 are most adjacent as shown in FIG. 3B. Therefore, the larger the total area of the necked portions 8, the higher the bonding strength. Moreover, this total area is determined by measuring the areas of the remaining portions in the electrolessly plated layer 7 on the surface of the ceramic substrate A after the electrolessly plated layer 7 is peeled off from the ceramic substrate A. Supposing that a ratio of total area of the necked portions 8 to a given surface area of the substrate (surface area of the ceramic substrate A) is indicated by percentage %, which is called as an area of the necked portion 8 in the space 6, the following explanation will be made by using such percentage indication. In FIG. 4A and FIG. 4B are shown a scanning electron microphotograph and its schematically plan view of the remaining portion in the electrolessly plated layer 7 cut at the necked portions 8. As previously described, the total area of the necked portions 8 is determined by measuring and summing the individual surface area of the remaining portion in the electrolessly plated layer 7 in FIG. 4A and FIG. 4B.

In the conventional ceramic substrate having no multilayer structure as mentioned above, the area of the necked portion 8 is almost zero. In order to obtain a practical bonding strength, the ratio of total area of the necked portions 8 is necessary to be not less than 0.5% but not more than 10%. When the number of the spaces 6 is too large, the mechanical strength of the surface-layer ceramic 3 itself decreases to cause the breakage of the ceramic structure. The ratio is preferably within a range of 3~7%.

The number of the spaces 6 is required to be not less than 3,000 per unit square millimeter in order to obtain a practical bonding strength, and the satisfactory bonding strength is obtained when the number of spaces is up to 150,000. Preferably, it is 5,000 to 20,000 per unit square millimeter.

FIG. 5A and FIG. 5B show a case that the ceramic substrate A is provided with an electrolessly plated layer 7 and further with an electroplated layer 9 for immediately thickening the plated thickness. FIG. 5A shows a case that the number of the spaces 6 is large and the area of the space 6 per one necked portion 8 is small and the spaces 6 are completely filled with the electrolessly plated layer 7. On the other hand, FIG. 5B shows a case that the number of the spaces 6 is small and the area of the space 6 per one necked portion 8 is large and the spaces 6 are incompletely filled with the electrolessly plated layer 7.

In case of FIG. 5B, even after the formation of the electroplated layer 9, spaces 10 not filled with the plated layers 7, 9 remain in a greater part of the spaces 6. These spaces 10 are produced due to the fact that when the electroplated layer 9 is formed, the electrolytic current concentrates in upper ends 11 of the greater parts of the spaces 6 to immediately cover the spaces. Such a space 10 wastes partially the effective surface area of the ceramic substrate A to be bonded without any contribution to the improvement of the bonding strength. Therefore, it is preferred that the length L of the necked portion 8 in the space 6 is selected so as to be shorter than two times of the thickness of the electrolessly plated layer 7 to be formed.

Furthermore, the aforementioned anchor effect to the electrolessly plated layer 7 can be more raised by subjecting the granular ceramic material 2 to a surface roughening treatment.

Moreover, the bonding strength of the electrolessly plated layer 7 to the ceramic substrate A can be further increased by heating after the formation of the electrolessly plated layer 7 to form a chemical reaction layer on the interface between the electrolessly plated layer 7 and the ceramic substrate A.

The spaces 6 can be controlled by a combustible space-forming material such as graphite, carbon granule and the like having a size for forming the desired space 6 between the granular ceramic materials 2, 2. Moreover, when the above sintering, is carried out in an oxidizing atmosphere, the problem of remnant space-forming material can be prevented.

The method of forming a multilayer structure of the green sheet 1 and the surface-layer ceramic 3 constituting the ceramic substrate A will be described below.

①A method in which the granular ceramic material 2 is mixed with an organic binder, an organic solvent, a plasticizer, a space-forming material and so on to form a pasty slurry having a viscosity of 2,000 cps and the slurry is spread on both sides of the band-like green sheet 1 by means of a reverse coaster process;

②A method in which the band-like green sheet 1 previously sprayed at both sides thereof with a solvent is passed through a container filled with a mixture of the granular ceramic material 2 and the space-forming material, and then passed between pressure rolls to adhere the granular ceramic material 2;

③ A method in which a slurry having a viscosity of about 200 cps by mixing an organic binder, an organic solvent, a plasticizer, a space-forming material and so on with the granular ceramic material 2 likewise the method ① is applied to one side or both sides of the green sheet 1 by means of spray coating process;

④ A method in which the aforementioned slurry previously transferred to a transfer paper is transferred to one side or both sides of the green sheet 1;

⑤ A method in which the above slurry is printed on one side or both sides of the green sheet 1 by a screen printing process;

⑥ A method in which the granular ceramic material 2 is directly spread and pressed on the surface of the green sheet 1.

It is to be noted that after the multilayer structure is formed by any one of the above methods, even if these structures are piled one upon the other and simultaneously fired, they are not bonded to each other by fusing. Specifically, since the purity of the ceramic in the surface-layer portion is high, they are not bonded by fusing during the firing.

The invention will be described with reference to the following examples.

Example 1

An alumina powder having an average particle size of 3 $\mu$m as a granular ceramic material 2 was mixed with a butyral resin (polymerization degree: 800) as an organic binder in a weight ratio of 10:1 in addition to a plasticizer and an organic solvent. To the resulting mixture was added carbon powder of #400 mesh as a space-forming material in an amount of 0 vol%, 10 vol%, 20 vol% or 30 vol% to the volume of the alumina powder to prepare four kinds of slurries each having a viscosity of about 1,500 cps. Each of the resulting slurries was spread on both sides of an alumina green tape 1 having a purity of 96% by a reverse coaster process so as to have a thickness of a surface-layer ceramic of 25~30 $\mu$m, which was fired in an oxidizing atmosphere at about 1,600° C. to form a ceramic substrate A.

Next, the ceramic substrate A was subjected to pretreatments of degreasing sensitizing, activation and acceleration according to a process of Trademark "Naiko-CER" marketed by Kizai Co., Ltd. and then subjected to an electroless nickel plating to form an electrolessly plated layer 7 of 2 $\mu$m in thickness. Therefore, an electroplating of copper was carried out in a plating bath containing copper sulfate to form an electroplated layer 9 of 30 $\mu$m in thickness.

The cross section of the copper-plated ceramic substrate A is shown as a scanning electron microphotograph and its schematic view in FIG. 6A and FIG. 6B. As seen from these drawings, the granular protruding portions 5 were formed. Moreover, numeral 12 indicates a copper plated layer (by electroless plating and electroplating). Then, the ceramic substrate was sintered at 150° C., etched by photolithography to form patterns of 2 mm square, and a copper lead of 0.8 mmΦ was soldered perpendicularly thereto. By using this copper lead, the bonding strength between the ceramic substrate A and the electrolessly plated layer 7, and the like, was measured.

The measured results for the above four slurries (sample No. 1~No. 4) are shown in Table 1. For the comparison, a ceramic substrate having no surface-layer ceramic was prepared and its bonding strength and the like were similarly measured to obtain results as shown in Table 1. It is apparent from Table 1 that the bonding strength of the ceramic, substrate A having the surface-layer ceramic 3 is twice as strong when compared with that of the ceramic substrate having no surface-layer ceramic.

TABLE 1

| Sample | Amount of carbon powder vol % | Bonding strength kg/mm$^2$ | Area of necked portion in space % | Number of spaces spaces/mm$^2$ | Average surface roughness $\mu$m |
|---|---|---|---|---|---|
| 1 | 0 | 2.2 | 3 | 9100 | 0.6 |
| 2 | 10 | 2.2 | 4 | 10100 | 0.6 |
| 3 | 20 | 1.9 | 5 | 8000 | 0.7 |
| 4 | 30 | 2.0 | 9 | 3100 | 0.9 |
| Comparative | — | 1.0 | ≃0 | ≃0 | 0.4 |

(The measurement of the surface roughness was carried out by determining a center-line average roughness defined in JIS B0601 by means of a tracer type surface roughness meter prescribed at JIS B0652. In this case, the cut-off value and the measuring length were 0.8 mm and 2.5 mm, respectively.)

Example 2

A ceramic substrate A was prepared by the same procedure as in Example 1 except that the same alumina powder as in Example 1 was mixed with a butyral resin (polymerization degree: 800) in a weight ratio of 20:1, which was subjected to an electroless plating with a commercially available copper plating agent used for usual printing substrate to form an electrolessly plated layer 7 of 2 $\mu$m in thickness. Thereafter, a copper electroplating was carried out to form an electroplated layer of 30 $\mu$m in thickness, and then the bonding strength and the like were measured in the same manner as in Example 1.

The measured results are shown in Table 2 (sample No. 5). For the comparison, a ceramic substrate in which the weight ratio of alumina powder to butyral resin(polymerization degree: 800) was 20:5 was prepared and the measurement was performed together with a ceramic substrate having no surface-layer ceramic to obtain results as shown in Table 2. As seen from Table 2, as the weight ratio of the butyral resin or organic binder increases, the bonding strength rises, but the breakage of the surface-layer ceramic itself results and hence the exact measurement of the space 6 can not be performed. Further, the value of the average surface roughness is not less than 1.0 $\mu$m.

TABLE 2

| Sample | Ratio of alumina powder to organic binder | Bonding strength kg/mm$^2$ | Area of necked portion in space % | Number of spaces spaces/mm$^2$ | Average surface roughness $\mu$m |
|---|---|---|---|---|---|
| 5 | 20:1 | 1.5 | 0.9 | 2300 | 0.5 |
| (Comparative) | 20:5 | 2.7 | could not be measured | could not be measured | 1.3 |
| (Comparative) | — | 0.3 | ≃0 | ≃0 | 0.4 |

Example 3

A zirconia powder having an average particle size of 1.8 $\mu$m as a granular ceramic material 2 was mixed with a butyral resin (polymerization degree: 800) as an organic binder in a weight ratio of 10:1 in addition to a plasticizer and an organic solvent to prepare a slurry having a viscosity of about 200 cps. This slurry was spread on both sides of an alumina green tape 1 having a purity of 96% by air spraying, which was fired in an oxidizing atmosphere at about 1,600° C. to form a ceramic substrate A. Then, an electrolessly plated layer 7 of 2 μm in thickness and an electroplated layer 9 of 30 μm in thickness were formed on the ceramic substrate A by the same electroless copper plating and copper electroplating as in Example 2, and then the bonding strength and the like were measured in the same manner as in Example 1.

The measured results are shown in Table 3 (sample No. 6). For the comparison, the above ceramic substrate A was subjected to a heat treatment in a nitrogen atmosphere at about 900° C. for 10 minutes and the similar measurement was performed to obtain results as shown in Table 3 (sample No. 7). It is apparent from the above results that the bonding strength can be further increased by the heat treatment.

TABLE 3

| Sample | Heat treatment | Bonding Strength kg/mm$^2$ | Area of necked portion in space % | Number of spaces spaces/mm$^2$ | Average surface roughness μm |
| --- | --- | --- | --- | --- | --- |
| 6 | absence | 2.2 | 2.1 | 5000 | 0.6 |
| 7 | presence | 2.7 | 2.1 | 5000 | 0.6 |

Industrial Applicability

According to the present invention, a strong and stable bonding strength of the electrolessly plated layer to the ceramic substrate is obtained by the anchor effect. Therefore, the ceramic substrate according to the present invention is particularly useful as a ceramic substrate for circuit boards of electronic parts.

I claim:

1. A ceramic substrate provided with an electrolessly plated layer on a surface thereof, comprising:
   a dense ceramic body; and
   a plurality of granular protruding portions formed on a surface of said dense ceramic body thereby defining a plurality of spaces between said granular protruding portions, said spaces having necked portions at points adjacent mid-sections of said granular protruding portions and base portions at points adjacent said dense ceramic body;
   wherein said base portions of said spaces are substantially wider than said necked portions thereof, such that said granular protruding portions provide anchoring means for said electrolessly plated layer, and said necked portions each have a length which is less than twice a thickness of said electrolessly plated layer.

2. The ceramic substrate of claim 1, wherein said substrate has a surface roughness of 0.4~1.0 μm as an average surface roughness.

3. A ceramic substrate provided with an electrolessly plated layer on a surface thereof, comprising:
   a dense ceramic body; and
   a plurality of granular protruding portions formed on a surface of said dense ceramic body thereby defining a plurality of spaces between said granular protruding portions, said spaces having necked portions at points adjacent mid-sections of said granular protruding portions and base portions at points adjacent said dense ceramic body;
   wherein a total area of said necked portions occupies 0.5~10% of a total area of said substrate, and said necked portions number 2,000~100,000 per mm$^2$.

4. The ceramic substrate of claim 3, wherein the total are of said necked portions occupies 3~7% of said total area of said substrate, and said necked portions number 5,000~20,000 per mm$^2$.

5. The ceramic substrate of claim 3, wherein said substrate has a surface roughness of 0.4~1.0 μm as an average surface roughness.

* * * * *